(12) United States Patent
Hollister et al.

(10) Patent No.: US 6,377,591 B1
(45) Date of Patent: Apr. 23, 2002

(54) MODULARIZED FIBER OPTIC LASER SYSTEM AND ASSOCIATED OPTICAL AMPLIFICATION MODULES

(75) Inventors: Jack Herbert Hollister, Chesterfield; Mark Steven Zediker, Florissant, both of MO (US)

(73) Assignee: McDonnell Douglas Corporation, St. Louis, MO (US)

( * ) Notice: Subject to any disclaimer, the term of this patent is extended or adjusted under 35 U.S.C. 154(b) by 0 days.

(21) Appl. No.: 09/208,191

(22) Filed: Dec. 9, 1998

(51) Int. Cl.$^7$ ................................................ H01S 3/30
(52) U.S. Cl. ................................ 372/6; 372/34; 372/35; 372/36
(58) Field of Search ................................ 372/6, 29.021, 372/35, 36

(56) References Cited

U.S. PATENT DOCUMENTS

| | | | |
|---|---|---|---|
| 3,741,292 A | * 6/1973 | Aakalu | .......................... 165/105 |
| 3,851,267 A | 11/1974 | Tanner | |
| 4,230,902 A | 10/1980 | Hug et al. | |
| 4,507,789 A | 3/1985 | Daly et al. | |
| 4,807,696 A | * 2/1989 | Colvin | ........................... 165/10 |
| 4,933,949 A | 6/1990 | Johnson | |
| 5,007,478 A | * 4/1991 | Sengupta | ...................... 165/10 |
| 5,013,151 A | 5/1991 | Hughes | |
| 5,048,027 A | 9/1991 | Hughes et al. | |
| 5,052,010 A | 9/1991 | Blumentritt et al. | |
| 5,185,757 A | 2/1993 | Finch | |
| 5,258,989 A | 11/1993 | Raven | |
| 5,278,860 A | 1/1994 | August, Jr. et al. | |
| 5,280,494 A | 1/1994 | Toepel | |
| 5,287,371 A | 2/1994 | Bournes | |
| 5,317,509 A | 5/1994 | Caldwell | |
| 5,355,387 A | 10/1994 | English, Jr. et al. | |
| 5,369,661 A | 11/1994 | Yamaguchi et al. | |
| 5,418,809 A | 5/1995 | August, Jr. et al. | |
| 5,475,702 A | 12/1995 | August, Jr. et al. | |
| 5,694,408 A | 12/1997 | Bott et al. | |

FOREIGN PATENT DOCUMENTS

WO     WO96/41404     12/1996

\* cited by examiner

*Primary Examiner*—Teresa M. Arroyo
*Assistant Examiner*—Gioacchino Inzirillo
(74) *Attorney, Agent, or Firm*—Alston & Bird LLP

(57) ABSTRACT

The modularized fiber optic laser system includes at least one master oscillator for producing a master laser signal and a plurality of optical amplification modules that independently amplify portions of the master laser signal. Each optical amplification module includes a plurality of optical fiber amplifiers and at least one pump source associated with each optical fiber amplifier for pumping the respective optical fiber amplifier. The optical amplification module also includes a power source for providing power to the pump sources. Each optical amplification module preferably consumes no more than a first predetermined amount of power during operation. As such, the power source is adapted to provide at least a first predetermined amount of power without recharging and without power generation. Each optical amplification module is also designed to produce no more than a first predetermined amount of heat during operation. The optical amplification module is therefore adapted to store at least the first predetermined amount of heat such that the optical amplification module can be operated without creating a thermal signature.

22 Claims, 3 Drawing Sheets

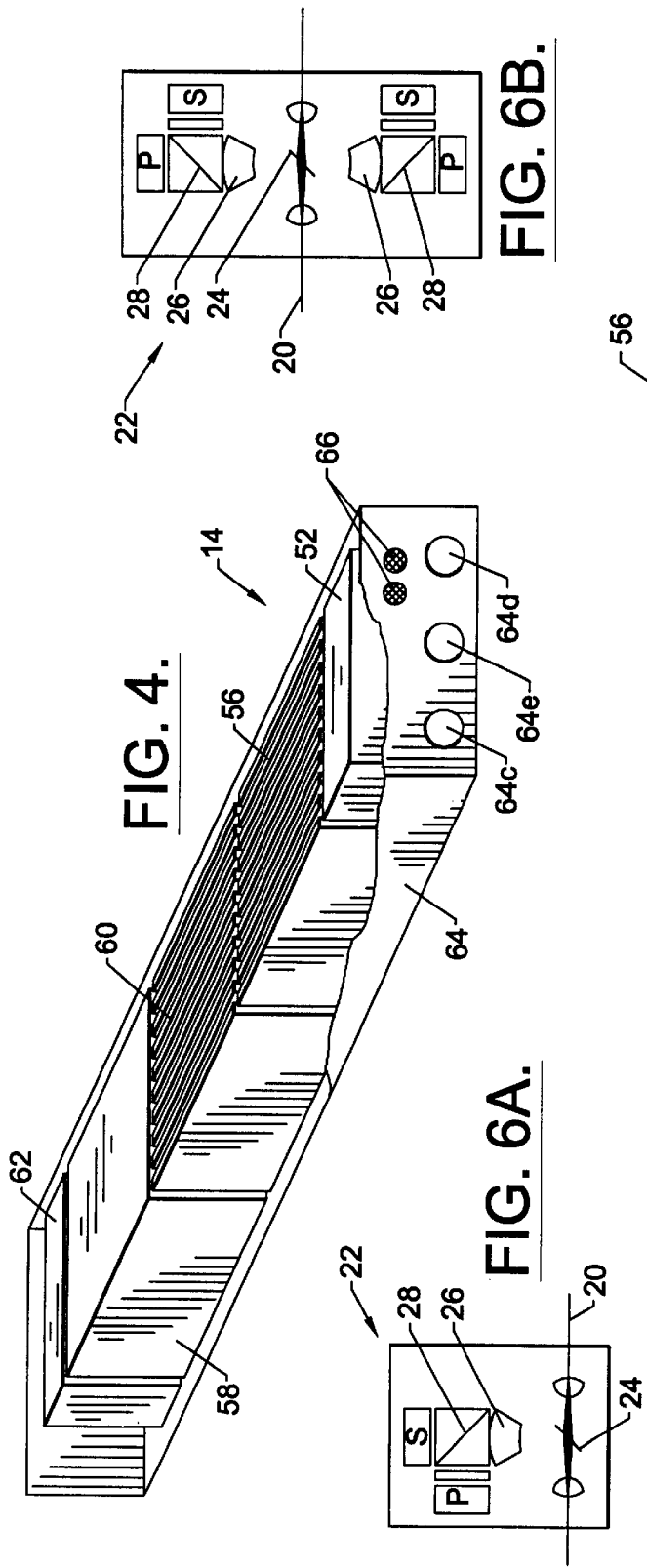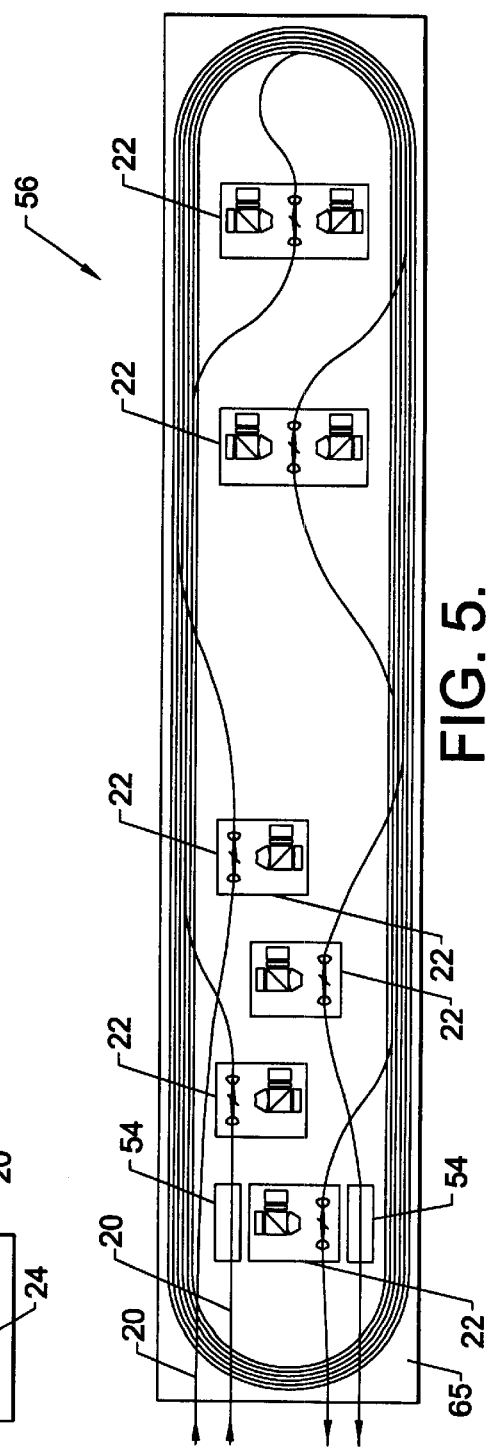

MODULARIZED FIBER OPTIC LASER SYSTEM AND ASSOCIATED OPTICAL AMPLIFICATION MODULES

GOVERNMENT LICENSE RIGHTS

The United States Government has rights in this invention as provided for by the terms of contract number DASG60-96-C0196 on behalf of the Department of the Army.

FIELD OF THE INVENTION

The present invention relates generally to laser systems and associated lasing methods and, more particularly, to modularized laser systems employing optical fiber amplifiers and associated modularized lasing methods.

BACKGROUND OF THE INVENTION

Lasers are presently employed for a wide variety of applications. For example, lasers are employed to process materials, such as by cutting, welding, heat treating, drilling, trimming and coating materials. Lasers are also employed to strip paint, remove coatings, clean surfaces and provide laser markings. Lasers can also be directly applied, such as via single mode optical fibers, for a variety of medical and other applications.

Lasers are also increasingly employed in military applications, including laser weapon and laser ranging systems and electro-optical countermeasure systems. Laser communication systems have also been developed. In one more specific application, lasers can produce plasma on an illuminated surface, such as a metallic, oxide, composite, liquid or gaseous surface. The production of plasmas on the illuminated surface can produce x-rays, such as the x-rays employed in x-ray lithography.

Along with the ever increasing number of applications in which lasers are used, the demands on the laser systems are also increasing. For example, a number of applications are demanding laser systems be relatively rugged, lightweight, capable of operating in different environmental conditions, maintainable and serviceable without incurring excessive cost or experiencing prolonged downtime. In addition, laser systems are now being required to continue to operate with little degradation on a system level as components or portions of the laser system fail or otherwise become inoperative. In other words, some laser systems are required to be relatively immune on a system level to the failure of components or portions of the laser system. A number of applications are also demanding that the laser systems have little, if any, thermal signature and require little, if any, input power or power generation during operation such that the laser systems can operate independently in a manner which is relatively undetectable.

Notwithstanding the increasing demands being placed upon laser systems, laser systems must also be readily manufacturable such that the cost of the laser systems are competitive. As such, laser systems are preferably scalable so as to provide a wide range of output power levels from moderate power levels to the increasingly higher power levels demanded by some modern applications. While a variety of laser systems have been developed in order to service various ones of the applications described above, few, if any, of the conventional laser systems are readily manufacturable in such a manner that the resulting laser system is scalable so as to provide a wide range of output power levels while at the same time being relatively immune to degradation, at a system level, as a result of the failure of components of the laser system and while generating little, if any, thermal signature and requiring little, if any, power input or power generation during operation.

SUMMARY OF THE INVENTION

According to the present invention, a modularized fiber optic laser system and an associated optical amplification module are provided. As a result of the modularized design, the fiber optic laser system of the present invention is readily manufacturable and is scalable so as to provide a wide range of output power levels. The modularized design also permits the fiber optic laser system to be relatively immune, at a system level, to the failure of one or more of the optical amplification modules such that the performance of the fiber optic laser system degrades only a little, if at all, as a result of the failure of an optical amplification module. In addition, the modularized design permits the cooling, power and control functions of the fiber optic laser system to be both distributed and simplified. As a result, the optical amplification modules can operate independently without producing a thermal signature or without requiring power input or power generation during operation.

The modularized fiber optic laser system of the present invention includes at least one master oscillator for producing a master laser signal and a plurality of independent optical amplification modules that receive a portion of the master laser signal from the master oscillator. Each optical amplification module includes a plurality of optical fiber amplifiers for receiving and amplifying respective portions of the master laser signal and at least one pump source associated with each optical fiber amplifier for pumping the respective optical fiber amplifier. The optical amplification module also includes a power source, such as a battery, for providing power to the pump sources.

Each optical amplification module preferably consumes no more than a first predetermined amount of power during operation. As such, the power source is adapted to provide at least a first predetermined amount of power without recharging and without power generation. In embodiments in which the power source is a battery, for example, the battery is preferably adapted to provide at least as much power as the optical amplification module is designed to consume during operation. As such, each optical amplification module can be operated without receiving external power and without requiring power generation during operation. However, each optical amplification module can also include a battery charger for charging the battery during periods in which the optical amplification module is inactive.

Each optical amplification module is also designed to produce no more than a first predetermined amount of heat during operation. The optical amplification module of one advantageous embodiment therefore includes temperature control means for receiving and storing at least the first predetermined amount of heat such that the optical amplification module can be operated without creating a thermal signature.

According to one advantageous embodiment, the temperature control means is a heat sink having a thermal mass sufficient to store the heat which will be generated during operation of the optical amplification module. Each optical amplification module can also include a housing in which the optical fiber amplifiers, the pump source, the power source and the temperature control means are disposed. As such, the temperature control means of this embodiment can include a coolant that at least partially fills the housing such that the plurality of optical fiber amplifiers, the pump sources and the power source are immersed in the coolant. In one embodiment, the coolant includes a micro-encapsulated phase change material.

The modularized fiber optic laser system can also include a beam combiner for receiving and combining the amplified portions of the master laser signal from the plurality of optical fiber amplifiers. The modularized fiber optic laser system can also include a plurality of phase modulators, associated with respective ones of the optical fiber amplifiers, for controllably adjusting the phase of the respective amplified laser signal.

The modularized fiber optic laser system of the present invention also preferably includes means for controlling each of the optical amplification modules and/or the master oscillator based upon the output of the modularized fiber optic laser system. According to this embodiment, the modularized fiber optic laser system can include a detector for detecting a sample of the amplified portion of the master laser signal output by a respective optical amplification module. The optical amplification module can, in turn, include a controller for controlling operation of the optical amplification module in response to a signal from the detector. Similarly, the modularized fiber optic laser system can include a detector for detecting a sample of the combined output of the plurality of optical amplification modules associated with a respective master oscillator. The modularized fiber optic laser system of this embodiment can therefore also include a master oscillator controller for providing control signals to the respective master oscillator in response to a signal from the detector. By appropriately controlling the master oscillators and the plurality of optical amplification modules, the output of the modularized fiber optic laser system can be precisely controlled in both amplitude and phase and can be steered, if so desired.

As a result of the modularized design, the fiber optic laser system of the present invention is therefore readily manufacturable and is scalable so as to provide a wide range of output power levels suitable for a wide variety of applications. The modularized design also permits the fiber optic laser system to be relatively immune, at a system level, to the failure of one or more of the optical amplification modules such that the performance of the fiber optic laser system degrades only a little, if at all, as a result of the failure of an optical amplification module. In addition, the modularized design permits the cooling, power and control functions of the fiber optic laser system to be both distributed and simplified. As a result, the optical amplification modules can operate independently without producing a thermal signature or without requiring power input or power generation during operation.

DETAILED DESCRIPTION OF THE DRAWINGS

FIG. 4 is a fragmentary perspective view of the optical amplification module of FIG. 3.

FIG. 5 is a schematic diagram of one of the fiber laser amplifier circuit boards of the optical amplification module of FIGS. 3 and 4 which illustrates the optical fiber amplifiers and the associated phase modulators and pump sources.

FIGS. 6A and 6B are schematic diagrams of a single pump module and a dual pump module, respectively, for pumping an optical fiber amplifier of an optical amplification module according to one embodiment of the present invention.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
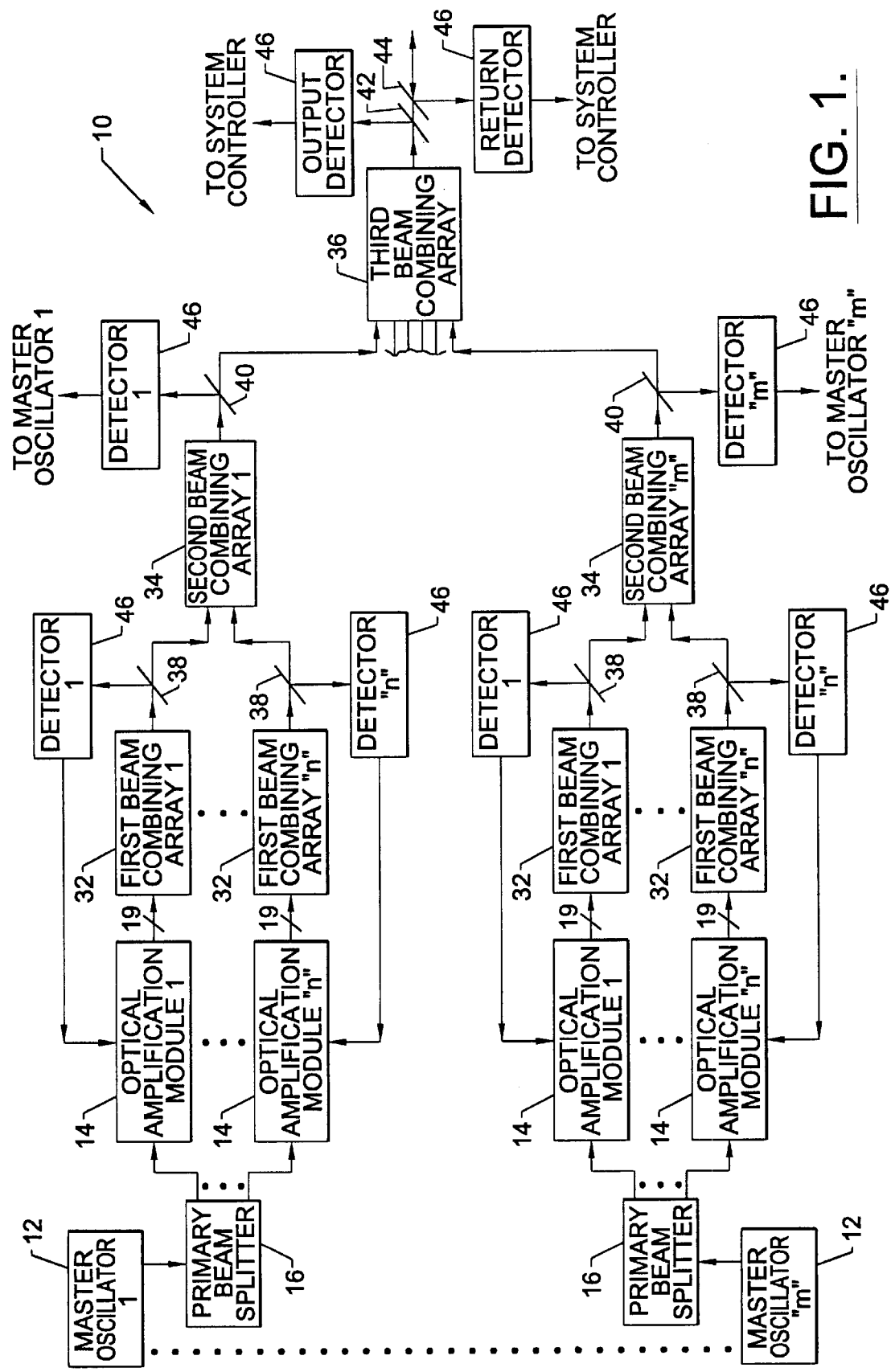
FIG. 1 is a block diagram illustrating the components of one embodiment of a modularized fiber optic laser system of the present invention.

Referring now to FIG. 1, a modularized fiber optic laser system 10 according to one embodiment of the present invention is illustrated. The modularized fiber optic laser system includes at least one master oscillator 12 and, more commonly, a plurality of master oscillators. Each master oscillator of the modularized fiber optic laser system is preferably the same type of laser, such as a diode pumped fiber laser, a single mode diode laser, a diode pumped mode-locked oscillator or diode pumped rods, slabs or mirrors. Each master oscillator preferably provides a master laser signal having a predetermined wavelength, typically the same predetermined wavelength, and a predetermined power level. For example, the master laser signal may have a predetermined wavelength of 1064 nanometers and a predetermined power level of 20 mW. However, the master laser signal can have other wavelengths and power levels without departing from the spirit and scope of the present invention. In addition, each master oscillator preferably provides a master laser signal having a predetermined wavefront, such as $TM_{00}$, and a predetermined linewidth, such as 30 gigahertz. Typically, each master oscillator provides a master laser signal having the same predetermined wavefront and the same predetermined linewidth.

Although not necessary for the practice of the present invention, each master oscillator 12 preferably emits a single mode primary master signal. In addition, each master oscillator preferably generates a continuous wave (cw) master laser signal. However, the amplitude, frequency, or phase of the master laser signals provided by the master oscillators can be modulated. As such, the master oscillators can be configured to produce a variety of waveforms, such as long pulse or short pulse, without departing from the spirit and scope of the present invention. In any event, the master oscillators effectively establish the spectral and temporal waveform for the entire fiber optic laser system 10 as described hereinafter.

As known to those skilled in the art, optical feedback is created by optical reflections throughout the laser system 10 and from amplified spontaneous emission during amplification of the signals. Optical feedback is disruptive to the temporal stability of the master oscillators 12 and impedes the formation of an output laser beam. Consequently, unwanted backward propagating power is preferably suppressed within the laser system, such as with one or more optical isolators placed downstream of the master oscillators. Optical isolators allow the signals emitted by the master oscillators to propagate in a forward direction, while suppressing backward propagating noise.

According to the present invention, each master oscillator 12 is associated with or drives a plurality of independent optical amplification modules 14. In one embodiment, the modularized fiber optic laser system 10 includes six master oscillators, each of which is associated with or drives fifty-seven optical amplification modules. As such, the modularized fiber optic laser system can include a primary beam splitter 16 positioned between a respective master oscillator and the plurality of optical amplification modules associated with the respective master oscillator in order to split the master laser signal generated by the respective master oscillator into a plurality of master laser subsignals. These master laser subsignals are then directed to respective ones of the associated optical amplification modules. Typically, the master laser subsignals are directed to the associated optical amplification modules by means of optical fibers that extend between the primary beam splitter and the plurality of associated optical amplification modules.

Figure 2:
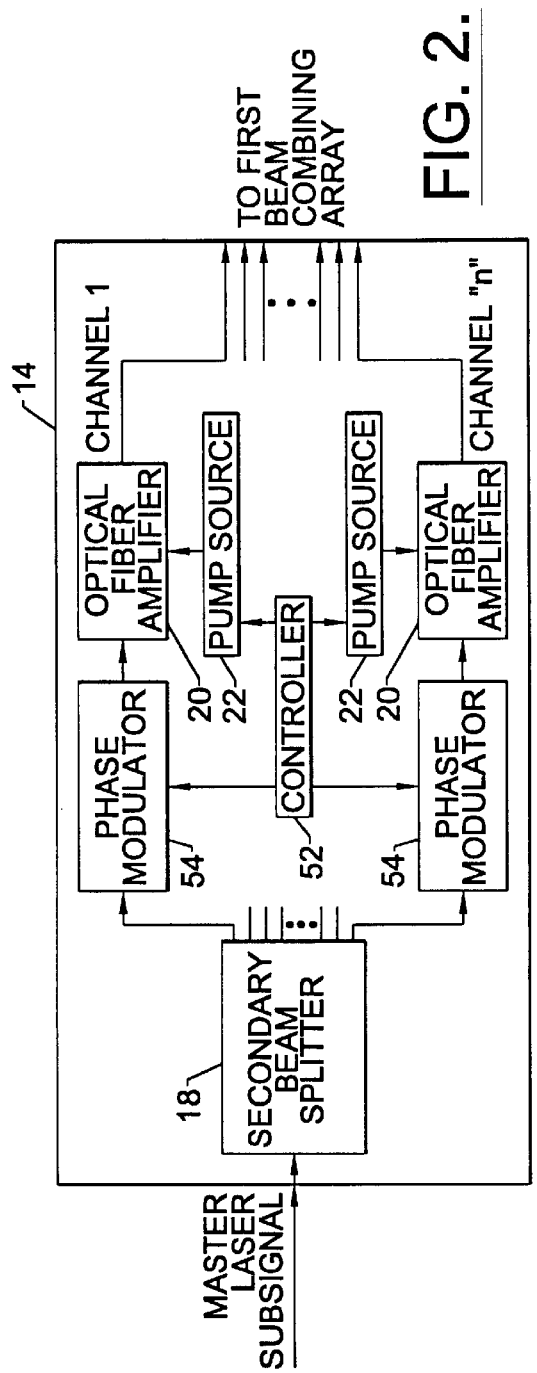
FIG. 2 is a more detailed block diagram of one of the master oscillators of the modularized fiber optic laser system of FIG. 1 as well as an associated optical amplification module.

As shown in more detail in FIG. 2 in which one of the associated optical amplification modules 14 is depicted, each optical amplification module preferably includes a plurality of parallel channels, such as twenty channels, for example. Since the optical amplification module includes a plurality of parallel channels, the optical amplification module also preferably includes a secondary beam splitter 18 for dividing the master laser subsignal received by the optical amplification module into a plurality of secondary signals, one of which will be amplified by each of the channels of the optical amplification module. Although the primary and secondary beam splitters can be embodied in many different forms, the primary and secondary beam splitters can be passive couplers, such as 3 dB fiber couplers or 1:N single mode star couplers, such that the frequency and wavelength of the laser signals are not altered.

The optical amplification module 14 also includes a plurality of optical fiber amplifiers 20 for receiving and amplifying a respective secondary signal. Typically, each channel of the optical amplification module includes a respective optical fiber amplifier. As described in more detail by U.S. Pat. No. 5,694,408 which issued Dec. 2, 1997 to Eric H. Bott, Robert R. Rice and Mark S. Zediker and which is assigned to McDonnell Douglas Corporation, the contents of which are incorporated herein in their entirety, the optical fiber amplifier of one embodiment includes an optical fiber having a core doped with one or more rare earth elements such as ytterbium, neodymium, praseodymium, erbium, holmium and thulium. Alternatively, the optical fiber amplifier can include a dual core optical fiber having an inner core doped with one or more rare earth elements, such as ytterbium, neodymium, praseodymium, erbium, holmium and thulium, an outer core surrounding the inner core and a cladding layer surrounding the outer core. In one embodiment, however, the numerical aperture of the dual core optical fiber is increased by coating the outer core with a soft gold coating, instead of the cladding layer.

The optical amplification module 14 also includes at least one pump source 22 associated with each optical fiber amplifier 20 for pumping the respective optical fiber amplifier. Although each optical fiber amplifier can be pumped by a single pump source, the optical amplification module can include a plurality of pump sources distributed along the length of each optical fiber amplifier in order to sufficiently amplify the laser signals. See FIG. 5. The pump sources can include a laser diode, a laser diode array having a plurality of individual emitters, a fiber optic laser or other suitable pump laser.

As known to those skilled in the art, the pump source 22 provides pump signals of a predetermined wavelength to the optical fiber amplifier 20 which, in turn, excites the dopant, such as the rare earth elements, so as to amplify the secondary signals propagating therethrough. Preferably, the wavelength of the pump signals is different than the predetermined wavelength of the master laser signal. For example, the master laser signal can have a predetermined wavelength of 1064 nanometers while the pump signals can have a wavelength of 808 nanometers. However, for an optical fiber amplifier having a core doped with a rare earth element, the wavelengths of both the master laser signal and the pump signal are preferably within one of the absorption bands of the rare earth ion or, alternatively, within separate absorption bands of the rare earth ion.

In order to pump the optical fiber amplifier 20 off-axis, the pump source can include a beam combiner 24. See FIGS. 5, 6A and 6B. The beam combiner can include a dichroic beam combiner, such as a dichroic cube, a dichroic filter or a fused fiber coupler, for combining the secondary signal and the pump signals and for coupling the combined signals to the optical fiber amplifier. As best shown in FIGS. 6A and 6B, the secondary signals and the pump signals are preferably coupled to the optical fiber amplifier and to the various other optical elements, such as the beam combiner 24, with one or more lens elements 26, such as one or more collimating lenses or focusing lenses.

In order to further increase the amplification provided by the optical fiber amplifier 20, the pump source 22 of one embodiment can include a plurality of distributed pump sources for pumping a respective optical fiber amplifier at a plurality of spaced apart regions. As shown in FIG. 5, for example, the distributed pump sources can include one or more pump modules spaced along the length of the optical fiber amplifier. Each pump module can include one or more pairs of pump sources (designated Pump Source P and Pump Source S) adapted to produce respective pump signals having p-polarization and s-polarization states, respectively. Each pump module also includes a polarization beam combiner 28 for combining the respective pump signals of a respective pair of pump sources to produce a combined pump signal having a mixed polarization state, such as circular, different than either the first or second polarization states. By combining pump sources having different polarization states, the brightness of the combined pump signals can be increased relative to the respective brightness of the pump signals produced individually by either the first or second pump sources. Consequently, the respective optical fiber amplifier can be further excited so as to provide additional amplification of the secondary signals.

Alternatively, a pair of pump sources can produce respective pump signals having first and second wavelengths, respectively. The first and second wavelengths are preferably different. Accordingly, each pump module of this embodiment includes a dichroic beam combiner for combining the respective pump signals of a respective pair of pump sources to generate a combined pump signal having a mixed wavelength different than the first and second wavelengths and having increased brightness.

Although pump sources which provide pump signals of different polarization or different wavelengths are described and illustrated, these techniques can be combined such that the pump sources produce pump signals having both different polarization and different wavelengths which are subsequently combined to create a mixed pump signal having an even greater brightness. As shown in FIGS. 6A and 6B, the pump modules can include one or more pairs of pump sources with the single pump module of FIG. 6A including one pair of pump sources and the dual pump module of FIG. 6B including two pairs of pump sources.

Following amplification, the amplified laser signal of each channel of the optical amplification modules 14 can be optically combined to form a single amplified output. In order to optically combine the amplified laser signals, the modularized fiber optic system 10 preferably includes beam combining means. Typically, the beam combining means includes means for combining the plurality of amplified laser signals output by each of the channels of a respective optical amplification module in order to create a single laser output for the respective optical amplification module. As such, the beam combining means of this embodiment can separately combine the outputs of each of the optical amplification modules. The beam combining means can also include means for combining the single laser outputs of each of the optical amplification modules driven by a respective master oscillator 12 into a single laser output. As such, the beam combining means of this embodiment can separately combine the outputs attributable to each of the master oscillators. As will be apparent, the beam combining means can also include means for combining the single laser outputs attributable to each of the master oscillators to produce an overall system output.

The beam combining means can include a first beam combining array 32 downstream of a respective optical amplification module 14. The first beam combining array has a plurality of lens elements for collimating the amplified laser signals output by each channel of the respective optical amplification module. Typically, each lens element collimates the amplified laser signal output by a respective channel, i.e., a respective optical fiber amplifier 20. For example, the lens elements can include a plurality of graded index lens elements. In this embodiment, the index of grading of the lens element can be obtained by deliberately radially grading the index of refraction or by inducing a radial grading of the index of refraction by a thermal gradient in a homogenous medium. Alternatively, the lens elements can include corrected aspheric lens elements, holographic lens elements, binary diffractive lens elements, binary optic lens elements, surface refraction lens elements or other types of lens elements known to those skilled in the art.

The lens elements also preferably fill a predetermined aperture. In one advantageous embodiment, the lens elements fill an aperture at least as large as the cross-sectional shape of the lens element. As described and illustrated by U.S. Pat. No. 5,694,408, for example, the lens elements can have a hexagonal cross-sectional shape such that the lens elements preferably fill an aperture bounded by an imaginary circle extending tangential to the hexagonal cross-section of the lens elements.

While the lens elements preferably have a hexagonal cross-section, the cross-sections of the lens elements can have a variety of other shapes without departing from the spirit and scope of the present invention. Nevertheless, the lens elements are preferably arranged in a closely-packed array in order to provide a compact fiber optic laser system 10 with good beam forming and control characteristics. Accordingly, the cross-sectional shape of the lens elements is preferably adapted to mate adjacent lens elements having the same cross-sectional shape. In addition, the lens elements are preferably relatively long, such as 10 mm in one embodiment, in order to mechanically self-align the stacked array of lens elements.

The lens elements can be fabricated so as to have the predetermined cross-sectional shape by either pulling or extruding the lens element. For example, the boule from which the lens element is pulled can be formed to have the desired cross-sectional shape, such as by grinding, such that the resulting lens element will have the predetermined cross-sectional shape. However, other methods of fabricating the lens elements known to those skilled in the art can be employed without departing from the spirit and scope of the present invention.

The beam combining means also preferably includes a second beam combining array 34 downstream of the first beam combining arrays 32 in order to combine the single laser outputs of each of the optical amplification modules 14 driven by a respective master oscillator 12 into a single laser output. Still further, the beam combining means preferably includes a third beam combining array 36 downstream of the second beam combining arrays in order to combine the single laser outputs attributable of each of the master oscillators to produce an overall system output. As described above in conjunction with the first beam combining array, the second and third beam combining arrays include a plurality of lens elements for collimating the laser signals and for filling a predetermined aperture. As also described above in conjunction with the first beam combining array, the lens elements of the second and third beam combining arrays are preferably arranged in a closely-packed array and, as such, preferably have a hexagonal cross-sectional shape; although the lens elements can have other shapes without departing from the spirit and scope of the present invention.

The overall system output typically has a power level greater than the predetermined power level of the master laser signal. However, the overall power capability of the modulated fiber optic laser system 10 can be scaled during the system design by controlling the amplification and division of the master laser signal. In operation, the actual output power of the fiber optic laser system can be selected as desired within the overall power capability of the fiber optic laser system by appropriately adjusting the gain provided by one or more of the optical amplification modules 14. Further, the frequency of the overall system output preferably has a predetermined relationship to the frequency of the master laser signal. For example, the respective frequency of the master laser signal and the overall system output are preferably identical.

As shown in FIG. 1, the modularized fiber optic laser system 10 also includes beam sampling means, such as one or more beam splitters, for redirecting a portion of the laser output signals and detection means for detecting at least one predetermined characteristic of the laser output signals. The detection means or the control electronics which will be discussed hereinafter can then compare the detected characteristic with a predetermined reference characteristic. Fox example, the predetermined characteristic can include the phase and/or amplitude of the laser output.

As shown in FIG. 1, the beam sampling means can include a plurality of first beam splitters 38 for separately sampling the single laser outputs created by the first beam combining arrays 32 for each optical amplification module 14. Likewise, the beam sampling means can include one or more second beam splitter 40 for separately sampling the single laser outputs attributable to each of the master oscillators 12 and created by the second beam combining arrays 34. Similarly, the beam sampling means can include a third beam splitter 42 for sampling the overall system output created by the third beam combining array 36. Finally, the beam sampling means can include one or more fourth beam splitters 44 for sampling those portions of the returned or reflected laser signals attributable to each of the master oscillators.

According to this embodiment, the detection means can include a plurality of detectors 46; one of which is associated with each of the beam splitters for receiving respective ones of the samples. Although a variety of detectors can be utilized, the detectors can include detector arrays having a plurality of detector elements as described by U.S. Pat. No. 5,694,408 to Eric H. Bott, et al. While the detectors can analyze the predetermined characteristics of the sample relative to a predetermined value or relative to a reference signal, the detectors oftentimes provide signals representative of the predetermined characteristic of the sample to a controller or other control electronics for analysis.

In this regard, modularized fiber optic laser system 10 can include a system controller for receiving signals from the detector associated with the third beam sampler 42 in order to analyze and possibly adjust predetermined characteristics of the overall system output. In addition, each master oscillator 12 can include a controller or other control electronics for receiving signals from the detectors associated with the respective ones of the second and fourth beam samplers 40, 44 in order to analyze and possibly adjust predetermined characteristics of the portion of the overall system output attributable to the respective master oscillator. As will be described in more detail below, each optical amplification module 14 can also include a controller or control electronics 52 for receiving signals from the detectors associated with respective ones of the first beam samplers 38 in order to analyze and possibly adjust predetermined characteristics of the laser output of the respective optical amplification module.

Based upon the feedback from the beam sampling means and the detection means, various characteristics of the laser signals can be adjusted. For example, the amplitude of the laser signals output by each channel of each optical amplification module 14 can be individually modulated by controllably adjusting the pump power provided by the pump sources 22 associated with the respective optical fiber amplifiers 20, thereby controllably adjusting the power level of the overall system output. The relative phase of the laser signals output by each channel of each optical amplification module can also be individually modulated such that the laser signals output by each channel of each optical amplification module will add coherently. By modulating the relative phase of the laser signals output by each channel of each optical amplification module, the overall system output can be steered and the shape of the wavefront defined by the overall system output can be controlled.

In order to provide the desired phase modulation, each optical amplification module 14 can include phase adjustment means, such as one or more phase modulators 54, as illustrated in FIG. 2 and, in more detail, in FIG. 5. Typically, an optical amplification module includes a plurality of phase modulators, one of which is associated with each optical fiber amplifier 20. While a variety of phase modulators can be utilized, the phase modulators can include piezoelectric stretchers, lithium nitrate phase shifters or any of a variety of electrically actuated phase modulators, such as liquid crystal modulators, electro-optic phase modulators, in-line fiber optic phase modulators which are responsive to stress, electric fields, magnetic fields or temperature, adaptive optics such as microelectromechanical devices having movable mirrors, and other electrically-actuated phase modulators known to those skilled in the art.

While the phase modulators 54 can be directly driven by respective ones of the detectors 46, the phase modulators of an optical amplification module 14 are preferably controlled by the control electronics 52 of the respective optical amplification module in response to signals provided by the respective detector. As will be apparent to those skilled in the art, the phase modulators can alter the phase of the laser signals propagating through the respective optical fiber amplifiers 20 in order to create an output laser signal having a predetermined phase front. For example, by appropriately modulating the phase of each channel of the plurality of optical amplification modules, each of the amplified laser signals can be placed in phase such that the amplified laser signals of the various channels of the optical amplification modules will add coherently. In addition, the respective phases of the amplified laser signals can be modulated to maximize the resulting intensity of the overall system output as described in more detail in U.S. Pat. No. 5,604,408 to Eric H. Bott, et al. Therefore, by controllably adjusting the phase of the amplified laser signals, the modularized fiber optic laser system 10 of the present invention can produce an output signal having relatively high power and having controllable beam qualities, such as collimation and focus.

In order to preserve quality of the laser signals, the optical amplification module 14 and, more particularly, the optical fiber amplifier 20 can also include a filter (not shown), such as a fiber grating, a dichroic filter, a birefringent in-line filter, a Mach-Zehnder filter having an unequal path or an appropriately doped core of the optical fiber amplifier. The filter is preferably a band pass filter which preferentially removes signals having wavelengths outside a predetermined range of wavelengths centered about the predetermined wavelength of the master laser signal. Accordingly, spurious optical signals, such as signals generated by Raman scattering or other non-linear effects within the optical fiber amplifier at wavelengths other than the wavelength of the master laser signal, can be selectively attenuated, if not eliminated, at predetermined intervals to thereby diminish the effects of scattering within the optical fiber amplifier and, more particularly, to prevent undesirable gain reduction of the master laser signal.

In this same vein, each optical amplification module 14 preferably includes means for minimizing backward propagating signals. Although not illustrated, such means can be disposed at one or more input port(s) and/or one or more output port(s) of the module. For example, an optical isolator, such as a Faraday rotator element with appropriate polarizers as described above, can be disposed at one or more input and/or output port(s) to block backward propagating signals, such as amplified spontaneous emission.

Figure 3:
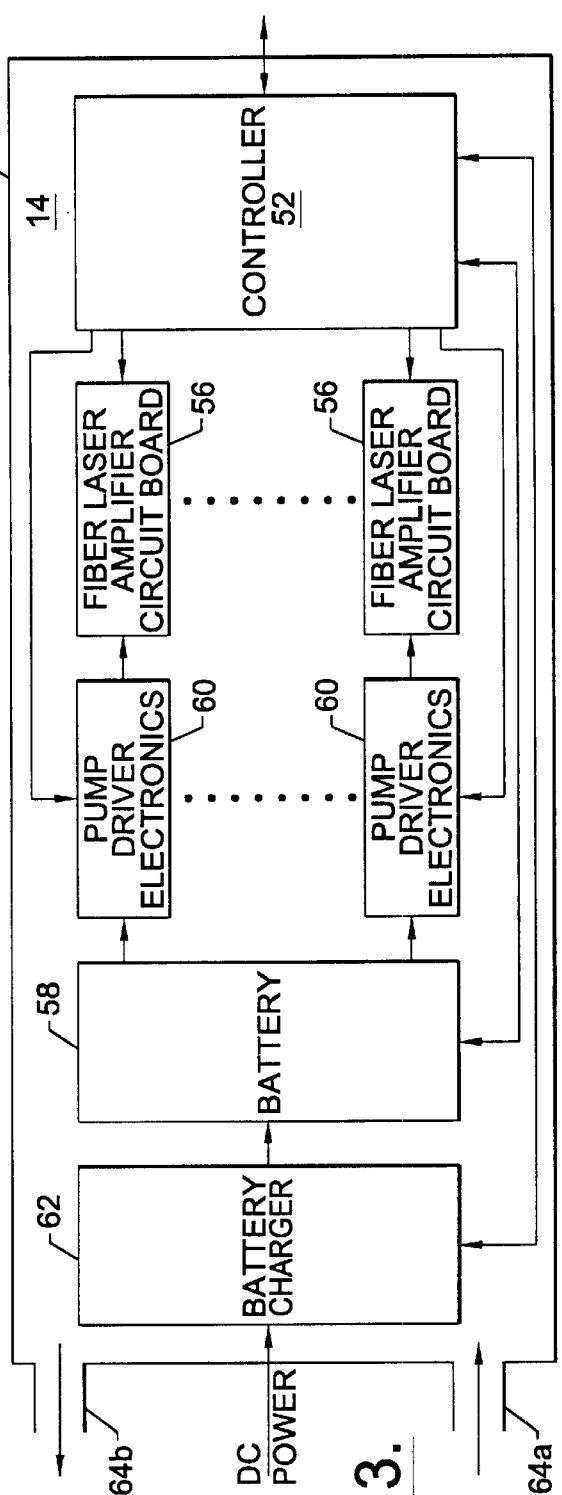
FIG. 3 is a block diagram of an optical amplification module according to one embodiment of the present invention.

According to the present invention, each optical amplification module 14 is preferably an independent line replaceable unit (LRU) that can be easily installed and can be replaced with equal ease if the optical amplification module begins to malfunction. As shown in FIGS. 3 and 4, an optical amplification module according to one embodiment of the present invention includes a number of fiber laser amplifier circuit boards 56 upon which one or more optical fiber amplifiers 20 are looped in order to minimize packaging requirements for the relatively long optical fiber amplifiers. In the embodiment shown in FIG. 3, for example, each fiber laser amplifier circuit board includes a pair of coiled optical fiber amplifiers. The pump sources 22 for pumping each of the optical fiber amplifiers are also mounted upon the fiber laser amplifier circuit board. As shown in FIG. 5, for example, a plurality of pump sources, including both dual pump modules and single pump modules, can be mounted upon the fiber laser amplifier circuit board for pumping the respective optical fiber amplifier. Additionally, a pair of phase modulators 54 can be mounted upon the circuit board. Each phase modulator typically is associated with a respective optical fiber amplifier in order to modulate the phase of the optical signals propagating therethrough.

For an optical amplification module 14 that includes twenty channels, the optical amplification module will typically include ten fiber laser amplifier circuit boards 56, each of which would have a pair of coiled optical fiber amplifiers 20. Although all twenty channels of an optical amplification module can be configured in parallel in order to amplify the master laser subsignals, the optical amplification module of one embodiment devotes one channel to preamplifying the master laser subsignal. In this regard, the incoming master laser subsignal can be initially introduced into one of the optical fiber amplifiers in order to be amplified or, more specifically, preamplified. This preamplification of the master laser subsignal is intended to increase the power level of the master laser subsignal prior to its division by the secondary beam splitter 18 which will significantly reduce the power level of each of the resulting secondary signals. The secondary beam splitter can then divide the preamplified master subsignal into nineteen secondary signals which are thereafter introduced or launched into respective ones of the nineteen remaining channels of the optical amplification module in which the secondary signals will be amplified and phase modulated prior to being recombined as described above.

According to the present invention, the optical amplification module 14 is designed to operate without thermal signature and without requiring power generation. Thus, the optical amplification module includes a power source for providing power to the pump sources 22 and temperature control means for receiving and storing the heat generated during operation of the optical amplification module. In particular, the optical amplification module is designed to consume no more than a first predetermined amount of power during operation, such as no more than 10 kilowatts during 2 minutes of operation, and to produce no more than a first predetermined heat during this same period of operation, such as no more than 1.2 megajoules. As such, the power source is adapted to provide at least the first predetermined amount of power without recharging and without power generation. Likewise, the temperature control means is adapted to store at least the first predetermined amount of heat. Thus, each optical amplification module can independently amplify the master laser subsignal without thermal signature and without power generation.

As shown in FIGS. 3 and 4, the power source typically include a battery 58, such as a lithium-polymer or thin film lead acid battery pack having the capacity to store at least as much power as will be required during the operation of the optical amplification module. The battery is electrically connected to pump driver electronics 60, such as a switch mode current source, which in turn provide power to the pump sources 22 mounted upon a respective fiber laser amplifier circuit board 56. The optical amplification module 14 can also include a battery charger 62 for receiving raw DC input power and for charging the battery during periods in which the optical amplification module is inactive.

As shown in FIG. 4, each optical amplification module 14 preferably includes a housing 64 in which the fiber laser amplifier circuit boards 56, the pump driver electronics 60, the battery 58, the battery charger 62 and the temperature control means are disposed. In addition, although the first beam combining array 32 is typically positioned external to the housing and downstream of the optical amplification module, the first beam combining array can also be disposed within the housing, if so desired. Although the housing can have different shapes and sizes, the housing of one embodiment is rectangular in shape and is approximately 12 inches×8 inches×40 inches in size. Similarly, while the housing can be constructed of different materials, the housing of one advantageous embodiment is constructed of a waterproof material, such as a graphite epoxy composite material.

The temperature control means preferably includes a heat sink 65 disposed within the housing 64 upon which the battery charger 62, the battery 58, the pump driver electronics 60 and the fiber laser amplifier circuit boards 56 are mounted. Although the temperature control means can include a variety of heat sinks, the heat sink of one advantageous embodiment is formed of aluminum.

In one embodiment, the temperature control means also includes a coolant that at least partially fills the housing 64 such that the fiber laser amplifier circuit boards 56, the pump driver electronics 60, the battery 58 and the battery charger 62 are immersed in the coolant. While the electrical components are preferably directly immersed in the coolant, the free space optical components, such as lenses or the like, are preferably encased in a hermetically sealed waterproof casing or shell, such as a casing constructed of copper, in order to prevent direct contact by the coolant with any the free space optical components. As will be apparent, the casing which houses the free space optical components should be designed such that optical fibers and electrical conductors or leads can enter the housing without disturbing the waterproof seal. While the temperature control means can include a variety of coolants, the coolant of one embodiment includes microencapsulated phase change material, such as small plastic beads filled with wax or the like, immersed within an inert coolant, such as a fluorocarbon liquid including FLUORINERT coolant provided by 3M or the like. During operation of the optical amplification module 14, the coolant remains within the housing and is not circulated such that the optical amplification module does not create a thermal output or a thermal signature. During periods in which the optical amplification module is inactive, however, the coolant is preferably circulated via a coolant inlet 64a and a coolant outlet 64b defined by the housing through an external chiller in order to discharge the heat stored by the coolant.

As described above, each optical amplification module 14 is designed to produce no more than the first predetermined amount of heat during operation. For an optical amplification module designed to consume approximately 10 kilowatts of power during operation, such as during two minutes of operation, the optical amplification module will generally generate approximately 1.5 kilowatts of optical output and approximately 8.5 kilowatts of heat. In this example, in order to operate without emitting a thermal signature, the heat sink, the coolant and the components themselves must therefore be capable of collectively storing at least 8.5 kilowatts of heat during the period of operation.

As mentioned above, the optical amplification module 14 also preferably includes control electronics 52, such as a microcontroller or a microprocessor, for controlling the operations of the optical amplification module. Among other things, the control electronics controls the pump sources 22 and the phase modulators 54 in order to properly pump the plurality of optical fiber amplifiers 20 and to properly modulate the phase of the secondary signals amplified by the optical fiber amplifiers. For example, the control electronics can control the pump sources and the phase modulators in response to signals received from the respective detector 46 in order to create a laser output having a desired power level and phase front, as described above. In addition, the control electronics can monitor the state of charge of the battery 58 and can control the battery charger 62 in order to appropriately charge the battery during periods of inactivity. The control electronics can also perform error testing in order to determine if the optical amplification module is malfunctioning.

As shown in FIG. 4, the housing 64 preferably defines a number of ports through one end thereof. In particular, the housing defines an input port 64c for receiving an optical fiber carrying the master laser subsignal from the respective master oscillator 12. In addition, the housing defines an output port 64d for permitting connection with the optical fiber amplifiers 20 of the optical amplification module 14 such that the amplified signals can be output therefrom. The housing also preferably defines communications port 64e for permitting bidirectional communications, typically optical communications, between the control electronics 52 of the optical amplification module and components external to the optical amplification module, such as the detectors 46.

The optical amplification module 14 also preferably includes at least one indicator 66, such as a light emitting diode (LED), that is exposed via an opening defined by the housing 64. The indicator is driven by the control electronics 52 to provide an visual indication as to the health or status of the optical amplification module. For example, the control electronics can illuminate a green LED in instances in which the optical amplification module is properly functioning and can illuminate a red LED in instances in which a control electronics has detected a malfunction or other error within the optical amplification module. In addition to illuminating a red LED, the control electronics would also transmit a signal, typically via the communications port 64e, to the system controller to provide notice of the error.

Due to the modularized design of the optical amplification modules 14, an optical amplification module can be readily replaced as an LRU in instances in which an error is detected. Since each optical amplification module operates independent of the other optical amplification modules of the modularized fiber optic laser system 10, problems or errors occurring within one of the optical amplification modules will not significantly disturb the overall system output and, in some instances, the outputs of the other optical amplification modules can actually be adjusted to compensate for the malfunctioning module. As such, the modularized fiber optic laser system of the present invention is relatively immune to the failure or malfunctioning of individual optical amplification modules such that the overall system performs degrades only slightly as a result of problems associated with individual optical amplification modules.

By utilizing optical amplification modules 14 as building blocks, the modularized fiber optic laser system 10 is readily scalable and can therefore produce laser output signals having a variety of power levels depending upon the number of optical amplification modules that are utilized to amplify the master laser subsignals. In addition, the optical amplification modules can be cascaded such that the output of a primary optical amplification module drives a plurality of secondary optical amplification modules in order to further amplify the master laser signal, while preserving the important characteristics of the master laser signal, including the frequency of the master laser signal.

Due to the relatively high power, the relatively high quality and the adaptability of the laser output, the modularized fiber optic laser system 10 of the present invention can be employed in a variety of applications, including laser communication systems and military systems, including laser weapons and ranging and remote sensing operations.

As a result of the modularized design, the optical amplification modules 14 are also more readily manufacturable. In this regard, a relatively large number of the identical modules can be manufactured in order to obtain economies of scale, thereby reducing the overall costs of the modularized fiber optic laser system in comparison to conventional laser systems.

In the drawings and the specification, there has been set forth a preferred embodiment of the invention and, although specific terms are employed, the terms are used in a generic and descriptive sense only and not for purpose of limitation, the scope of the invention being set forth in the following claims.

That which is claimed is:

1. A modularized fiber optic laser system comprising:
   at least one master oscillator for producing a master laser signal; and
   a plurality of independent optical amplification modules responsive to said at least one master oscillator, wherein each optical amplification module comprises:
      a plurality of optical fiber amplifiers for receiving and amplifying respective portions of the master laser signal;
      at least one pump source associated with each optical fiber amplifier for pumping the respective optical fiber amplifier;
      a power source for providing power to said pump sources; and
      temperature control means for receiving and storing heat generated during operation of said optical amplification module,
      wherein each optical amplification module consumes no more than a first predetermined amount of power during operation and produces no more than a first predetermined amount of heat during operation, wherein said power source provides at least the first predetermined amount of power without recharging and without power generation, and wherein said temperature control means stores at least the first predetermined amount of heat such that each optical amplification module independently amplifies the respective portion of the master laser signal without thermal signature and without power generation.

2. A modularized fiber optic laser system according to claim 1 wherein said temperature control means comprises a heat sink having a thermal mass which stores at least the first predetermined amount of heat.

3. A modularized fiber optic laser system according to claim 1 wherein each optical amplification module further comprises a housing, wherein said plurality of optical fiber amplifiers, said pump sources, said power source and said temperature control means are disposed within said housing, and wherein said temperature control means comprises a coolant that at least partially fills said housing such that said plurality of optical fiber amplifiers, said pump sources and said power source are immersed in said coolant.

4. A modularized fiber optic laser system according to claim 1 wherein said power source comprises a battery.

5. A modularized fiber optic laser system according to claim 1 further comprising a beam combiner for receiving and combining the amplified portions of the master laser signal from said plurality of optical fiber amplifiers.

6. A modularized fiber optic laser system according to claim 1 further comprising a plurality of phase modulators, associated with respective ones of said optical fiber amplifiers, for controllably adjusting the phase of the respective portions of the respective laser signal.

7. A modularized fiber optic laser system according to claim 1 further comprising a detector for detecting a sample of the amplified portion of the master laser signal output by a respective optical amplification module, and wherein each optical amplification module further comprises an optical amplification module controller, responsive to said detector, for controlling said respective optical amplification module in response to the detected sample.

8. A modularized fiber optic laser system according to claim 1 further comprising:
   a detector for detecting a sample of the combined amplified portions of the master laser signal output by said plurality of optical amplification modules associated with a respective master oscillator; and
   a master oscillator controller, responsive to said detector, for providing control signals to said respective master oscillator in response to the detected sample.

9. A modularized fiber optic laser system according to claim 4 wherein each optical amplification module further comprises a battery charger for charging said battery in response to input power received during periods in which said optical amplification module is inactive.

10. A modularized fiber optic laser system comprising:
   at least one master oscillator for producing a master laser signal; and
   a plurality of independent optical amplification modules responsive to said at least one master oscillator, wherein each optical amplification module comprises:
      a plurality of optical fiber amplifiers for receiving and amplifying respective portions of the master laser signal;
      at least one pump source associated with each optical fiber amplifier for pumping the respective optical fiber amplifier;
      a battery for providing power to said pump sources, wherein said battery provides at least as much power as said optical amplification module can consume during operation without recharging and without power generation; and
      a heat sink for receiving and storing heat generated during operation of said optical amplification module, wherein said heat sink stores at least as much heat as said optical amplification module can generate during operation such that each optical amplification module independently amplifies the respective portion of the master laser signal without thermal signature and without power generation;
   a detector for detecting a sample of the combined amplified portions of the master laser signal output by said plurality of optical amplification modules associated with a respective master oscillator; and
   a master oscillator controller, responsive to said detector, for providing control signals to said respective master oscillator in response to the detected sample.

11. A modularized fiber optic laser system according to claim 10 wherein said heat sink has a thermal mass which stores at least as much heat as said optical amplification module can generate during operation, and wherein said heat sink defines a passageway through which coolant flows during periods in which said optical amplification module is inactive.

12. A modularized fiber optic laser system according to claim 10 wherein each optical amplification module further comprises a battery charger for charging said battery in response to input power received during periods in which said optical amplification module is inactive.

13. A modularized fiber optic laser system according to claim 10 further comprising a beam combiner for receiving and combining the amplified portions of the master laser signal from said plurality of optical fiber amplifiers.

14. A modularized fiber optic laser system according to claim 10 further comprising a plurality of phase modulators, associated with respective ones of said optical fiber amplifiers, for controllably adjusting the phase of the respective portions of the respective laser signal.

15. A modularized fiber optic laser system according to claim 10 further comprising a detector for detecting a sample of the amplified portion of the master laser signal output by a respective optical amplification module, and wherein each optical amplification module further comprises an optical amplification module controller, responsive to said detector, for controlling said respective optical amplification module in response to the detected sample.

16. An optical amplification module for use in a modularized fiber optic laser system, the optical amplification module comprising:
   a plurality of optical fiber amplifiers for receiving and amplifying respective portions of a master laser signal;
   at least one pump source associated with each optical fiber amplifier for pumping the respective optical fiber amplifier;
   an internal controller for controlling operation of said pump sources;
   a power source for providing power to said controller and said pump sources; and
   temperature control means for receiving and storing heat generated during operation of the optical amplification module,
   wherein the optical amplification module consumes no more than a first predetermined amount of power during operation and produces no more than a first predetermined amount of heat during operation, wherein said power source provides at least the first predetermined amount of power without recharging and without power generation, and wherein said temperature control means stores at least the first predetermined amount of heat such that the optical amplification module independently amplifies the respective portion of the master laser signal without thermal signature and without power generation.

17. An optical amplification module according to claim 16 wherein said temperature control means comprises a heat sink having a thermal mass which stores at least the first predetermined amount of heat.

18. An optical amplification module according to claim 16 further comprising a housing, wherein said plurality of optical fiber amplifiers, said pump sources, said internal controller, said power source and said temperature control means are disposed within said housing, and wherein said temperature control means comprises a coolant that at least partially fills said housing such that said plurality of optical fiber amplifiers, said pump sources, said internal controller and said power source are immersed in said coolant.

19. An optical amplification module according to claim 16 wherein said power source comprises a battery.

20. An optical amplification module according to claim 17 wherein said heat sink defines a passageway through which coolant flows during periods in which the optical amplification module is inactive.

21. An optical amplification module according to claim 18 wherein said coolant comprises a microencapsulated phase change material.

22. An optical amplification module according to claim 19 further comprising a battery charger for charging said battery in response to input power received during periods in which the optical amplification module is inactive.

* * * * *